(12) United States Patent
Rosado et al.

(10) Patent No.: US 11,108,336 B1
(45) Date of Patent: Aug. 31, 2021

(54) POWER CONVERTER (71) Applicant: Hamilton Sundstrand Corporation, Charlotte, NC (US)

(72) Inventors: Sebastian Rosado, Cork (IE); Xin Wu, Glastonbury, CT (US); Robert H. Dold, Monson, MA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/821,210

(22) Filed: Mar. 17, 2020

(51) Int. Cl.
*H02M 7/00* (2006.01)
*H02M 7/537* (2006.01)
*H05K 7/20* (2006.01)

(52) U.S. Cl.
CPC ........... *H02M 7/003* (2013.01); *H02M 7/537* (2013.01); *H05K 7/209* (2013.01)

(58) Field of Classification Search
None
See application file for complete search history.

(56) References Cited

U.S. PATENT DOCUMENTS

| | | | | |
|---|---|---|---|---|
| 5,477,091 A * | 12/1995 | Fiorina | ............. | H02J 13/00034 307/66 |
| 6,822,850 B2 * | 11/2004 | Pfeifer | ...................... | F28F 3/12 174/72 B |
| 8,942,020 B2 | 1/2015 | Shepard | | |
| 9,042,112 B2 * | 5/2015 | Guan | ...................... | H05K 7/18 361/763 |
| 9,520,810 B2 | 12/2016 | Li et al. | | |
| 9,538,680 B2 | 1/2017 | Li et al. | | |
| 10,027,251 B2 | 7/2018 | Jones et al. | | |
| 10,306,814 B2 | 5/2019 | Schluer | | |
| 10,763,655 B2 * | 9/2020 | She | ......................... | H01G 4/228 |
| 10,951,128 B2 * | 3/2021 | Usui | ...................... | H02M 7/003 |
| 2013/0187453 A1 | 7/2013 | Flett et al. | | |
| 2013/0234636 A1 * | 9/2013 | Savatski | ............... | H02M 7/003 318/400.26 |
| 2015/0035496 A1 * | 2/2015 | Kikuchi | ................... | B60L 50/10 320/137 |
| 2016/0094153 A1 * | 3/2016 | Li | .......................... | H02M 7/797 363/123 |
| 2018/0183350 A1 | 6/2018 | Kadota | | |
| 2019/0366951 A1 | 12/2019 | Young et al. | | |
| 2020/0006197 A1 | 1/2020 | Hart et al. | | |
| 2020/0084878 A1 * | 3/2020 | Pando Rodriguez | ....................... | H05K 3/4644 |

FOREIGN PATENT DOCUMENTS

| | | |
|---|---|---|
| EP | 1445853 A2 | 8/2004 |
| EP | 3451520 A1 | 3/2019 |

OTHER PUBLICATIONS

European Search Report for Application No. 21152174.5, dated Jun. 25, 2021, 50 pages.

* cited by examiner

*Primary Examiner* — Courtney L Smith
(74) *Attorney, Agent, or Firm* — Cantor Colburn LLP (57) ABSTRACT

A layered DC busbar structure includes a positive DC substrate arranged to carry a positive DC voltage, the positive DC substrate being arranged on a first layer, and a negative DC substrate arranged to carry a negative DC voltage, the negative DC substrate being arranged on a second layer. A DC neutral substrate is arranged on a central layer between the first and second layers. An AC substrate is arranged to carry an AC voltage, the AC substrate being arranged on the central layer and substantially coplanar with the DC neutral substrate.

13 Claims, 12 Drawing Sheets

POWER CONVERTER

TECHNICAL FIELD

This disclosure relates to a DC link connection bus bar, in particular to a busbar with relatively low inductance, suitable for use in a power converter.

BACKGROUND ART

Generally, electrical applications—including aerospace and vehicular applications—make use of power converters to convert electrical power supplied by a source to a form suitable for onward supply to a load. Many power converters include a DC conversion stage, e.g. AC-DC converters, DC-AC converters, and DC-DC converters. In some such power converters, a 'DC link' connects semiconductor switching devices to electrical energy storage, which in general is provided by one or more capacitors.

The connecting means between the power switches and the capacitors is usually referred to as a 'DC busbar'. This busbar may also connect the DC conversion stage to an energy source or load. The parasitic parameters (e.g. the parasitic inductance and capacitance) of the DC busbar typically have a direct impact on the performance of the power converter.

Additionally, it is desirable in many applications (including but not limited to aerospace and vehicular applications) for the DC busbar implementation to be physically compact and light-weight. A smaller, lighter DC busbar may also be beneficial in terms of the amount of material used, and may aid in reducing the parasitic parameter values.

In power converters that serve a three-phase load, the DC busbar may have three 'phase legs' to supply each phase to the load. Of course, other n-phase arrangements are possible with the appropriate number of phase legs.

Some DC busbars, known in the art per se, are constructed from a layered (i.e. laminated) in which they are built from parallel layers of a conductive material.

The busbar of each phase leg of a three-level converter may be provided with four connection substrates—a positive DC substrate, a negative DC substrate, a DC neutral substrate, and an AC substrate. Depending on the type of power converter (e.g. AC-DC or DC-AC), the positive and negative DC substrates may be inputs (i.e. input terminals on these substrates are arranged to take a supply voltage) and the AC substrate may be an output (i.e. an output terminal on this substrate arranged to provide an output voltage) as in a DC-AC converter, or vice versa as in an AC-DC converter (i.e. an AC input and a DC output). The DC neutral substrate provides a current return path.

SUMMARY OF THE DISCLOSURE

In accordance with a first aspect, the present disclosure provides a layered DC busbar structure comprising: a positive DC substrate arranged to carry a positive DC voltage, said positive DC substrate being arranged on a first layer; a negative DC substrate arranged to carry a negative DC voltage, said negative DC substrate being arranged on a second layer; a DC neutral substrate arranged on a central layer between said first and second layers; and an AC substrate arranged to carry an AC voltage, said AC substrate being arranged on the central layer and substantially coplanar with the DC neutral substrate.

Thus it will be appreciated by those skilled in the art that examples of the present disclosure provide an improved DC busbar structure in which the DC neutral substrate and the AC substrate share a common layer, 'sandwiched' between the positive and negative DC substrates. This three-layer structure may help to minimise the parasitic inductance associate with the DC busbar, which may provide improvements in the performance of the busbar. In particular, this configuration may advantageously provide for a symmetric coupling of the DC neutral and AC layers to the positive and negative DC layers, with negligible coupling between the DC neutral and AC layers.

Furthermore, the layered DC busbar may have a reduced physical size and volume compared to conventional structures, which may provide significant improvements in the power density of the DC link in the power converter. Examples of the present disclosure may be particularly suitable for three-level power converters in applications requiring high power levels, e.g. power levels of hundreds of kilowatts and greater. The compactness of the layered DC busbar disclosed herein is facilitated by reducing the number of layers with respect to the number of terminals when compared to conventional approaches.

A further advantage afforded by examples of the present disclosure is that the layered structure may be readily extended to provide multiple phase legs. It has been appreciated that the positive DC substrate, negative DC substrate, and/or DC neutral substrate—and preferably all three of these—may be shared between multiple phase legs, where a separate AC substrate is provided for each phase leg. Thus, in some examples, the layered DC busbar comprises a plurality of AC substrates, each arranged to carry a respective AC voltage, wherein each AC substrate is arranged on the central layer and substantially coplanar with the DC neutral substrate. Thus the compact structure of the layered DC busbar provided in the present disclosure may be extended to multiple phase legs simply by adding further AC substrates in the central layer.

The central layer may be seen as being divided into two halves, where the DC neutral substrate occupies one half, and the AC substrate occupies the other half, where a gap is provided between these halves, this gap providing isolation between the DC neutral and AC substrates. It will be appreciated that these 'halves' may not necessarily be equal in size. Where multiple AC substrates are provided, these may together occupy the half of the central layer not occupied by the DC neutral substrate. The positive and negative DC substrates may, by contrast, occupy the full extent of their respective layers. Thus, in some examples, the positive and negative DC substrates substantially fully cover the central layer.

The first aspect of the disclosure extends to a power converter comprising a DC link, wherein the DC link comprises a layered DC busbar structure comprising: a positive DC substrate arranged to carry a positive DC voltage, said positive DC substrate being arranged on a first layer; a negative DC substrate arranged to carry a negative DC voltage, said negative DC substrate being arranged on a second layer; a DC neutral substrate arranged on a central layer between said first and second layers; and an AC substrate arranged to carry an AC voltage, said AC substrate being arranged on the central layer and substantially coplanar with the DC neutral substrate.

While the layered DC busbar structure may be useful for a number of different power converters, in some examples, the layered DC busbar structure is used for a three-level power converter, and in some examples it is used to provide a connection means for a 'T-type' three-level power converter.

In some examples, the power converter comprises: a DC voltage supply connected between a positive DC supply rail and a negative DC supply rail, wherein the positive DC supply rail is connected to the positive DC substrate, and wherein the negative DC supply rail is connected to the negative DC substrate; a first capacitor and a second capacitor connected in series between said positive and negative DC supply rails, said first and second capacitors being connected at a first node therebetween, wherein the first node is connected to the DC neutral substrate; an internal branch module comprising a first switching arrangement connected between the first node and a second node, wherein the second node is connected to the AC substrate; and an external branch module comprising a second switching arrangement, said second switching arrangement comprising first and second switches connected in series at the second node.

Generally, an AC circuit will be connected to the output of the power converter, i.e. at the second node. Thus in a set of examples, an external AC circuit is connected to the second node, optionally wherein the external circuit comprises an inductor connected to the second node. This inductor may be a discrete inductor, or may be the intrinsic inductance of, for example, a cable or an electrical machine connected to the output of the power converter.

A potentially overlapping set of examples is envisaged in which a plurality, for example two, DC voltage supplies are arranged in series between the positive and negative DC supply rails, wherein a common point between said plurality of DC voltage supplies is connected to the DC neutral substrate.

In a set of examples, the power converter comprises a second external branch module comprising a third switching arrangement, said second switching arrangement comprising first and second switches connected in series at the second node.

The first and second switches of each external branch module may be connected between the positive and negative DC supply rails, wherein the first switch is connected between the positive DC supply rail and the second node, and the second switch is connected between the second node and the negative DC supply rail.

The layered DC busbar may, in some examples, comprise a plurality of vias that provide electrical connections between the substrates, the rails, the nodes, and/or the switches of the power converter as appropriate. The layered DC busbar may, in some potentially overlapping examples, comprise further vias to provide for electrical connections to a drive circuit.

Beneficially, the first and second capacitors (or 'DC link' capacitors) can be mounted directly on the layered substrates and be provided with the necessary electrical connections to the appropriate layers directly so as to provide DC link functionality. This may also provide for a compact arrangement in which the DC link capacitors can be 'flush mounted' on the DC busbar, rather than being connected at an angle (e.g. perpendicular to) the DC busbar with connectors (or electrical 'bridges') to provide for connections to the rest of the circuit as in conventional arrangements known in the art per se.

Bendings, such as those used in conventional arrangements, increase the parasitic inductance because, depending on busbar characteristics like thickness and constructive factors, they may require increasing the distance between conducting layers. Bendings in the conductive paths also imply an asymmetry in the mutual coupling between those paths. Conversely, the improved connection with a shorter distance and no busbar bendings may advantageously lead to smaller parasitic parameters, especially parasitic inductance. This may translate into a smooth, safe transient commutation for the power semiconductors.

In some examples, the internal branch module may comprise first and second elongate substrates aligned along a first axis, said first elongate substrate being connected to the first node and said second elongate substrate being connected to the second node. The internal branch module can therefore be aligned such that it can be provided with connections to the AC and DC neutral substrates, i.e. it can 'straddle' the two halves of the central layer.

In some potentially overlapping examples, the, or each, external branch module may comprise first, second, and third elongate substrates aligned along a second axis, wherein the first elongate substrate is connected to the positive DC supply rail, the second elongate substrate is connected to the negative DC supply rail, and the third elongate substrate is connected to the second node.

In some examples in which two external branch modules are provided, the external branch modules may be placed side by side such that the current conductive path to the internal branch module is symmetrical, which may benefit the dynamic current sharing during the commutation transient. In addition, the close proximity of the modules may benefit the gate driver circuit because the smaller distances may further reduce the parasitic parameters associated with the gate circuit. This combined with a good symmetric circuit may also improve the dynamic current sharing.

In a set of examples, the first and second axes are substantially perpendicular to each other. This may provide for a compact layout, particularly in examples where the central layer is divided into halves as outlined above.

The power converter may comprise a heat sink. In a set of examples, the power converter comprises two layered DC busbars as outlined above, wherein the first layered DC busbar is positioned on a first side of the heat sink and the second DC busbar is positioned on a second side of the heat sink, opposite to said first side. The DC capacitors may then be shared between the DC busbars. This configuration has the clear benefit of a smaller size enabling considerably higher power densities than conventional configurations by requiring only one heat sink instead of two for the two DC busbars. An additional advantage is that the arrangement can be configured to connect the two sets of phase legs (i.e. the phase legs associated with each of the two DC busbars) with reduced parasitic parameters. This may enable improved operation of the complete power converter with a reduction in undesired interactions between the phase leg branches.

In accordance with such examples, the DC link can be arranged as a common DC link, i.e. in which its parts are connected through a low inductance path; or it can be arranged as two DC links forming part of separate circuits. Alternatively, even if they are part of the same circuit, they may be connected through a large impedance. In case of a common DC link, the capacitors may be integrated to a low inductance conductive structure that connects the various capacitor terminals among them and to the power modules.

BRIEF DESCRIPTION OF THE DRAWINGS

Certain examples of the present disclosure will now be described with reference to the accompanying drawings, in which.

DETAILED DESCRIPTION

Figure 1:
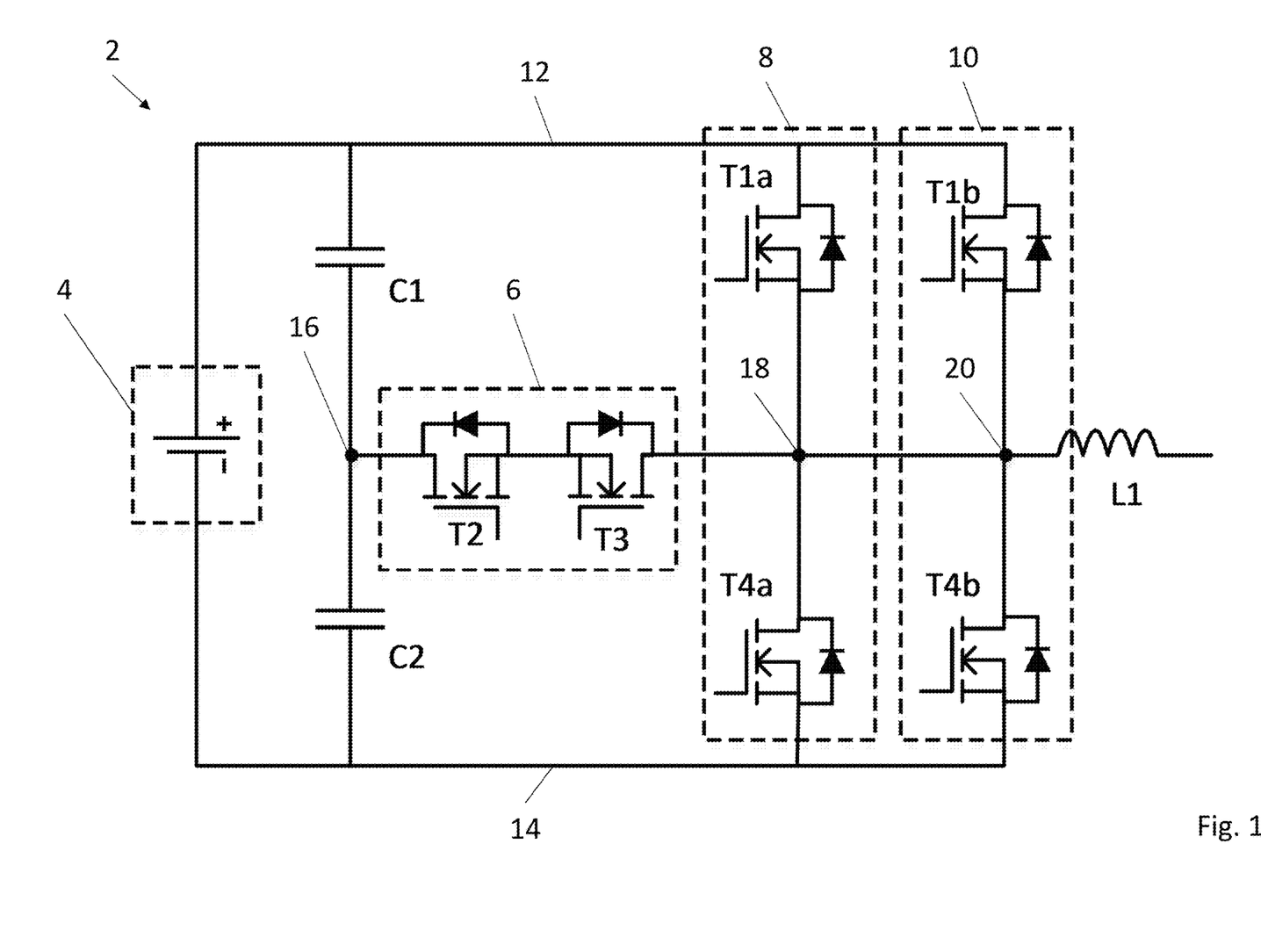
FIG. 1 is a circuit diagram of a T-type phase leg of a three-level power converter.

FIG. 1 is a circuit diagram of a T-type phase leg 2 of a three-level power converter. The phase leg 2 includes a DC voltage source 4, an internal branch module 6, and two external branch modules 8, 10. The DC power source 4 is connected between a positive DC supply rail 12 and a negative DC supply rail 14.

The internal branch module 6 and external branch modules 8, 10 are constructed from transistors T1a, T1b, T2, T3, T4a, T4b. These transistors T1a, T1b, T2, T3, T4a, T4b provide switching functionality, or 'commutation' as outlined below.

A pair of DC link capacitors C1, C2 are connected in series between the DC supply rails 12, 14, and are connected at a first node 16. These capacitors C1, C2 serve to smooth the DC voltage output of the DC voltage source 4. The DC link capacitors C1, C2 also protect upstream circuits from the transient response of downstream circuits. Typically, the DC link capacitor values are selected to optimise the stability of the DC voltage across the bus.

The first node 16 between the capacitors C1, C2 is connected to a second node 18 via the internal branch module 6, which is constructed from a pair of transistors T2, T3 arranged in series.

The first external branch module 8 is constructed from a pair of transistors T1a, T4a connected in series, where the transistors T1a, T4a are connected at the second node 18. Similarly, the second external branch module 10 is constructed from a pair of transistors T1b, T4b connected in series, where the transistors T1b, T4b are connected at a node 20, which is connected to the second node 18. Thus, effectively, the pair of transistors T1b, T4b are connected at the second node 18.

A first terminal of an inductor L1 is connected to the nodes 18, 20 between the transistors of the external branch modules 8, 10. By applying control signals to the gate terminals of the transistors T1a, T1b, T2, T3, T4a, T4b, an alternating signal is generated at the second terminal of the inductor L1. It will be appreciated that the inductor L1 may not form part of the power converter itself, and may be an external component. Generally, an inductance may be required, however this may be provided by e.g. the intrinsic inductance of a cable or the inductance of an electrical machine connected to the nodes 18, 20, rather than being a discrete component. However, a discrete inductor L1 is shown here for ease of explanation.

FIGS. 2A-E are schematic diagrams of semiconductor layouts for the T-type phase leg 2 of FIG. 1. As can be seen in the diagrams of FIGS. 2A-E, there are a number of different connection configurations that may be used. It will be appreciated that while the same reference numerals are used throughout FIGS. 2A-E to show which components correspond to the internal and external branch modules 6, 8, 10 described above, the configurations shown in these FIGS. 2A-E are alternatives to one another.

Figure 2A:
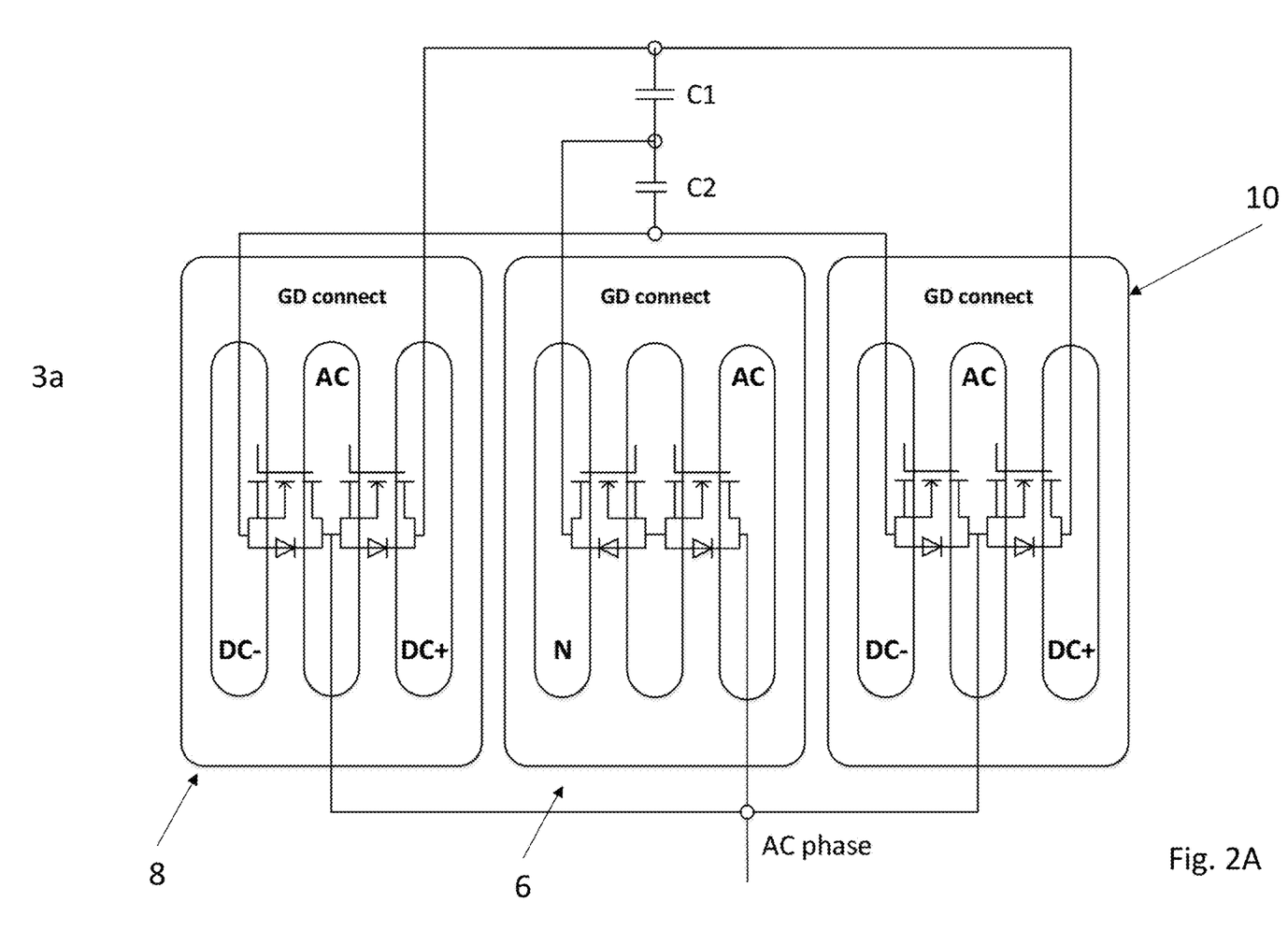
FIGS. 2A-E are schematic diagrams of semiconductor layouts for the T-type phase leg of FIG. 1.
Figure 2B:
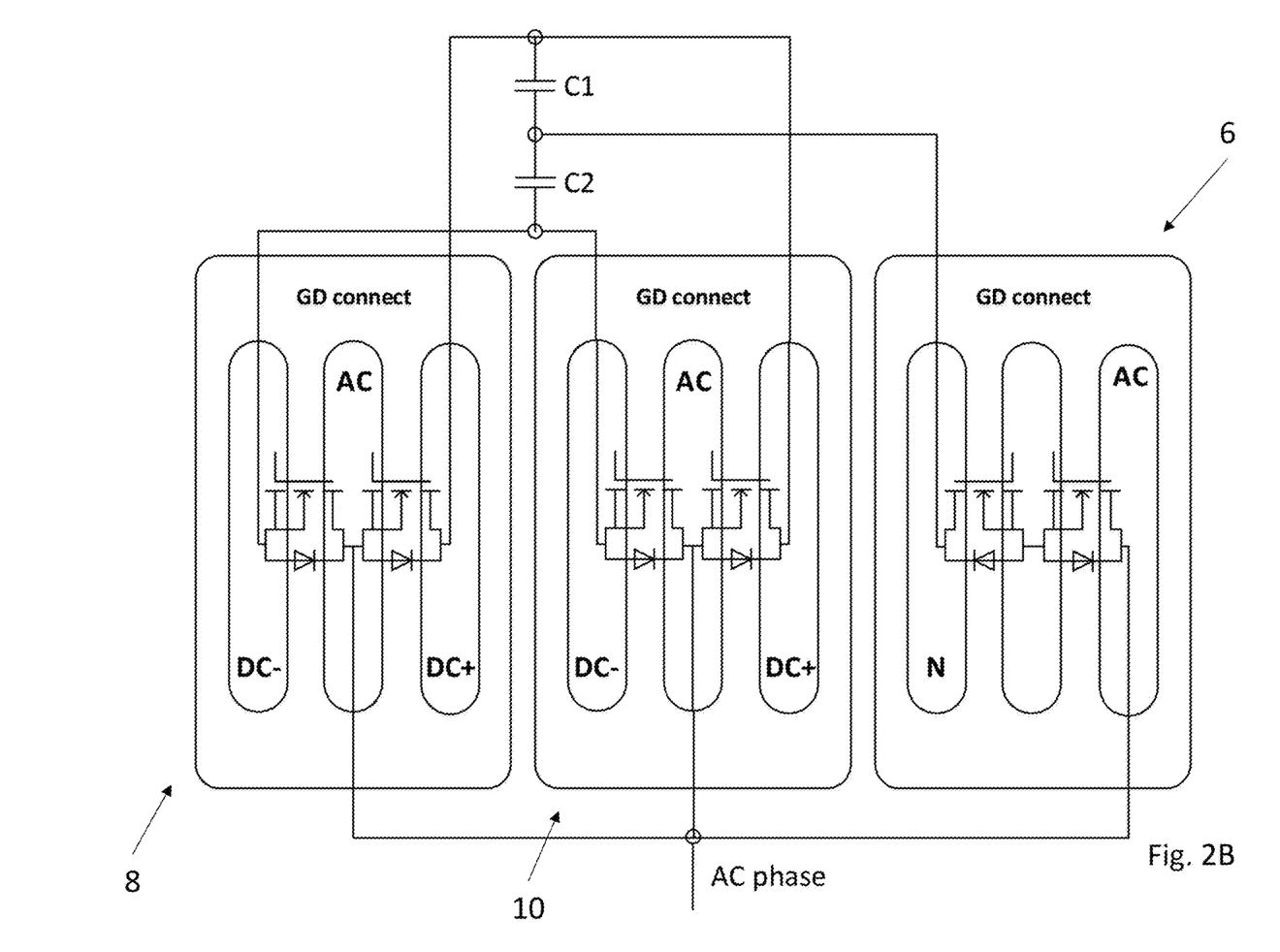
Figure 2C:
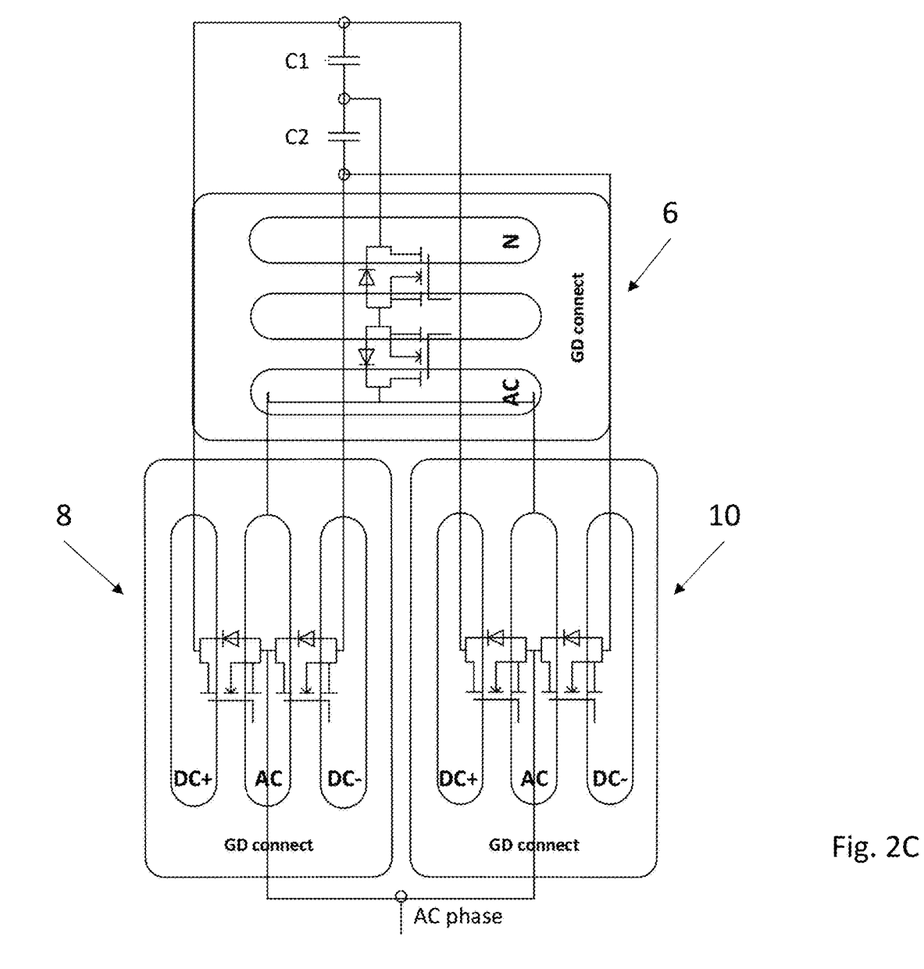
Figure 2D:
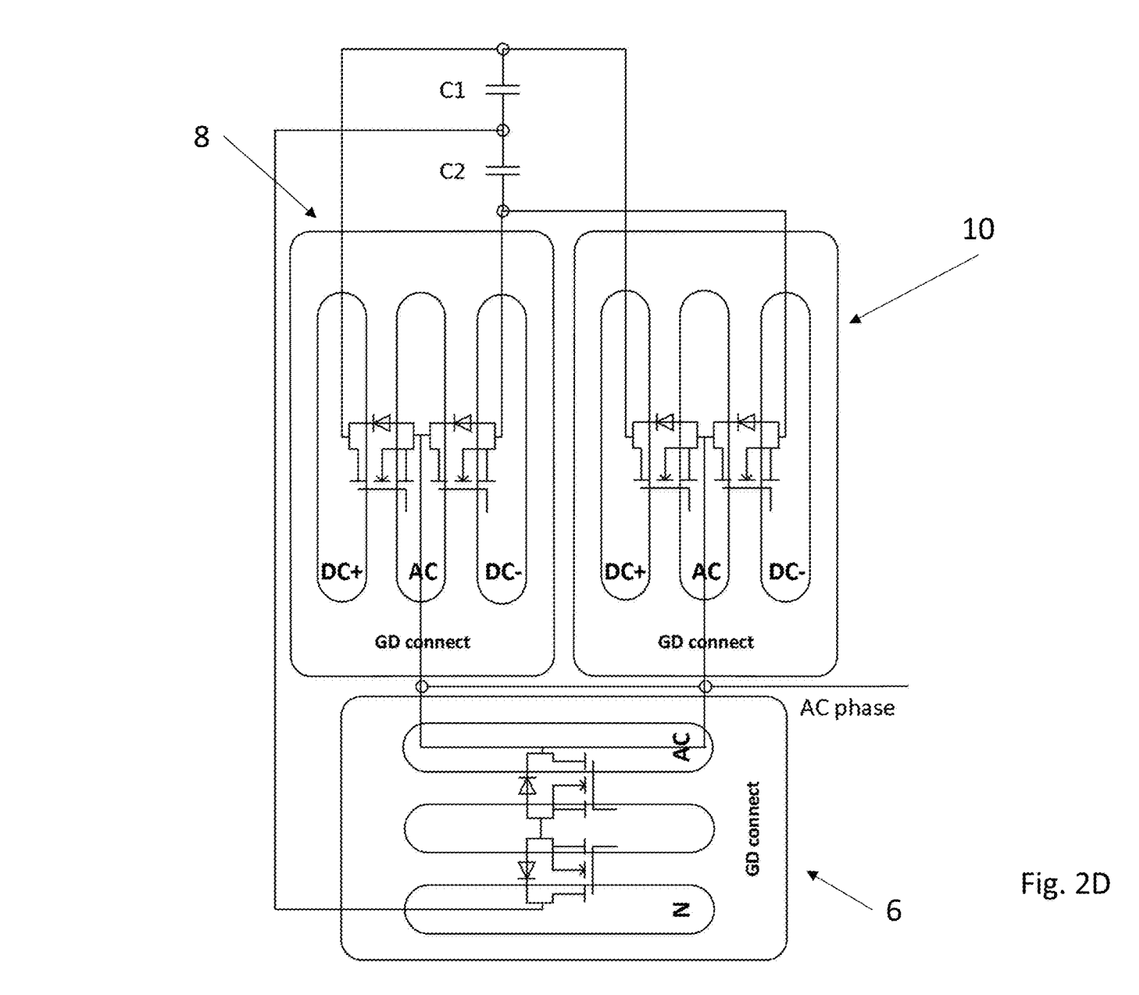
Figure 2E:
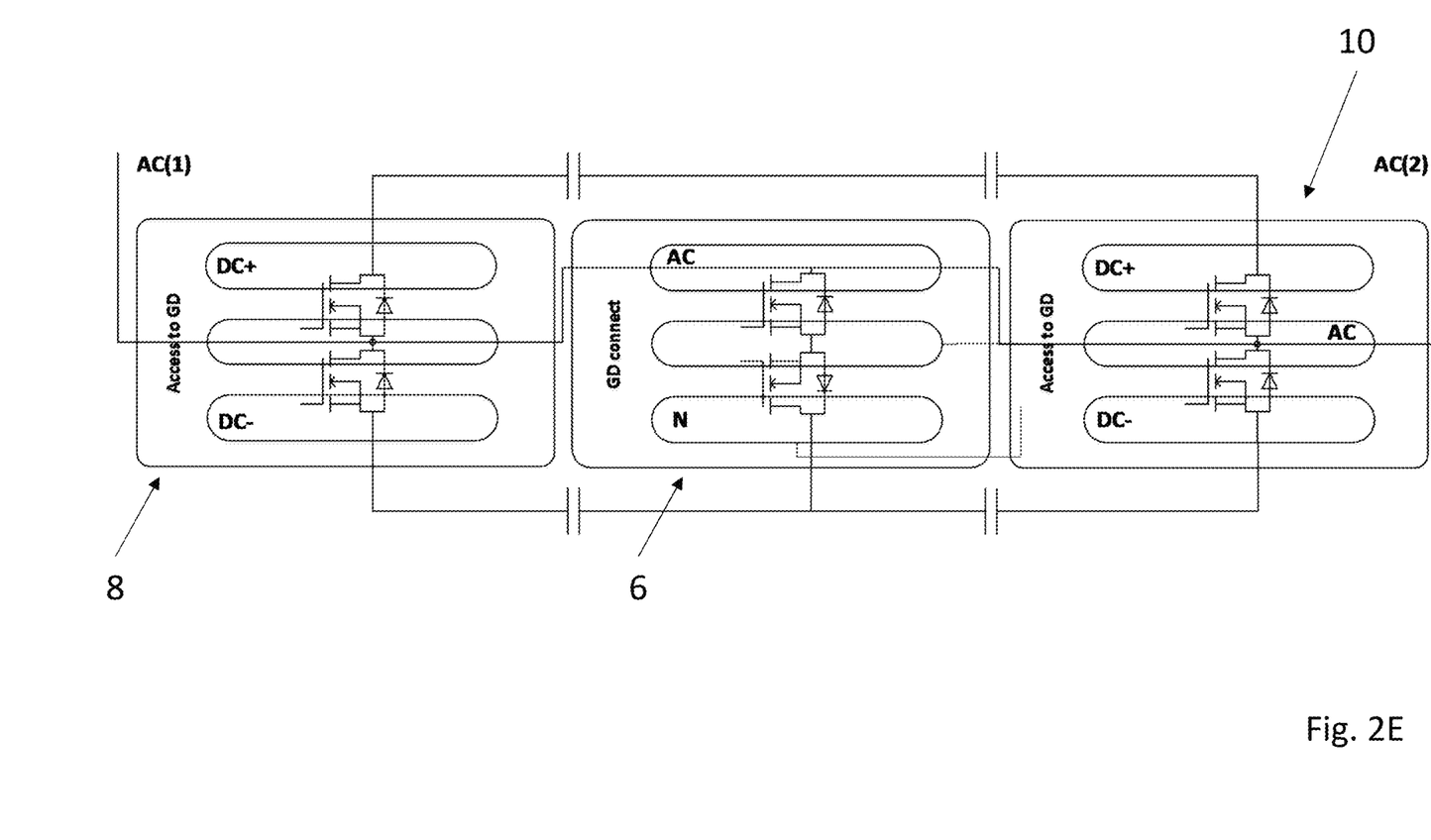

The configurations shown in FIGS. 2C and 2D are particularly advantageous due to their symmetry. The configuration of FIG. 2E provides for two AC voltage outputs AC(1), AC(2) that can be connected together externally.

In each of the configurations shown, the connections of the elongate substrates of the internal and external branch modules 6, 8, 10 are shown. Specifically, the internal branch module 6 includes a DC neutral substrate N, and an AC substrate AC. The external branch modules 8, 10 include a positive DC rail substrate DC+ connected to the positive DC supply rail 12, and a negative DC rail substrate DC– connected to the negative DC supply rail 14. The surrounding area of each of the modules 6, 8, 10 provides a ground connection GD connect. In other examples, the surrounding area may be isolated from the ground, i.e. it may be 'floating'.

Figure 3A:
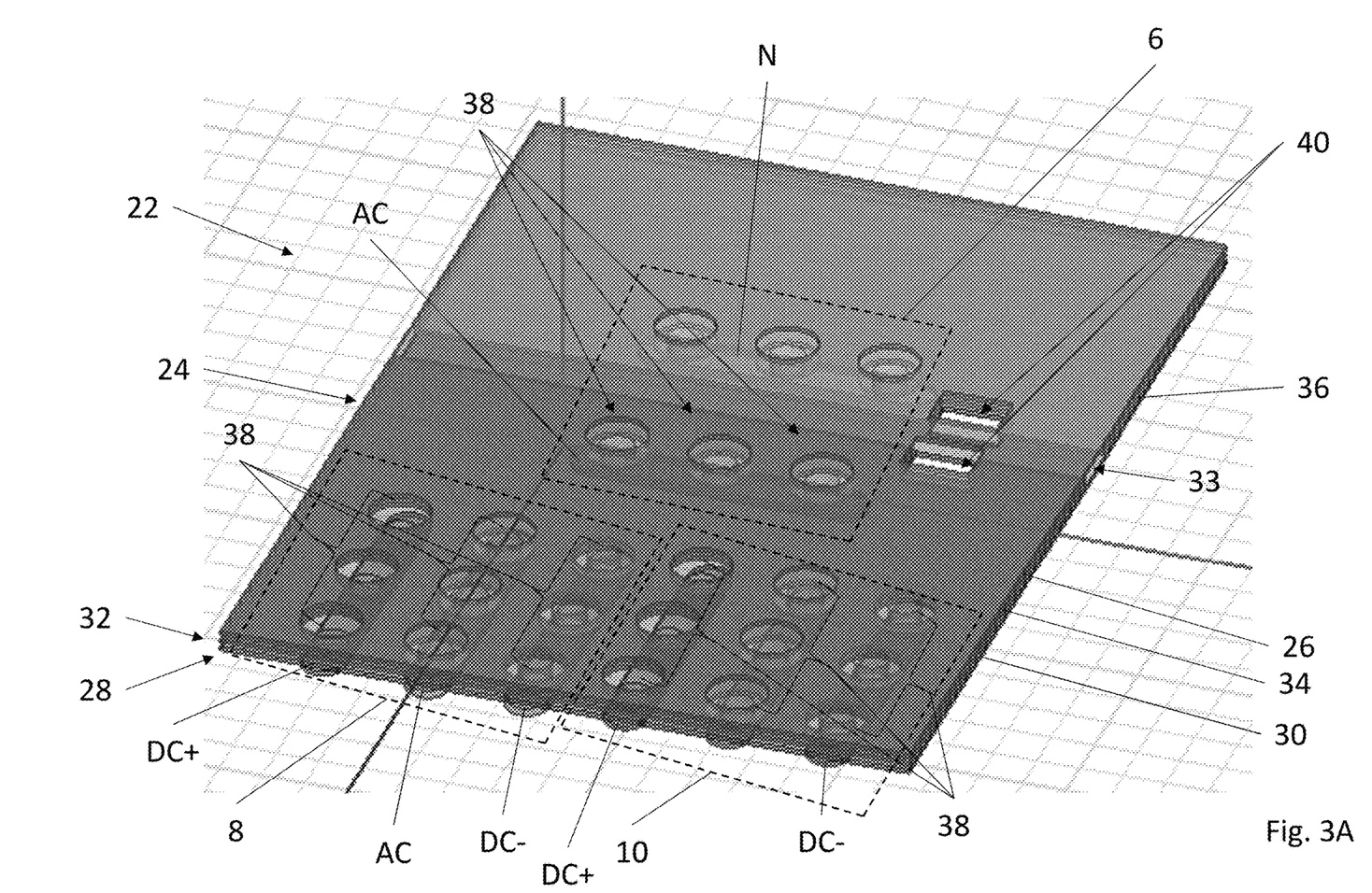
FIGS. 3A-B are schematic diagrams of a three-layer DC busbar structure in accordance with an example of the present disclosure.
Figure 3B:
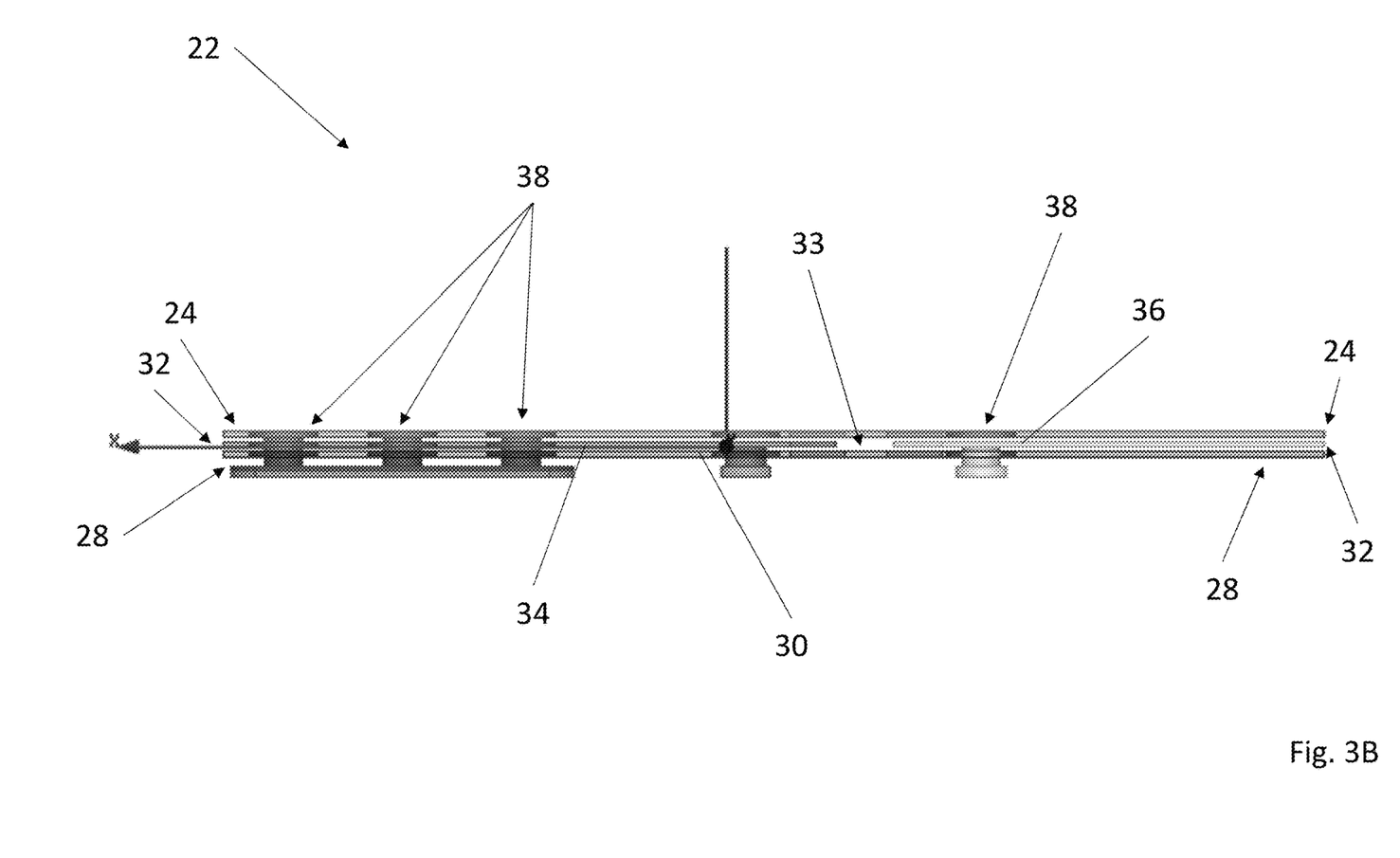

FIGS. 3A and 3B are schematic diagrams of a three-layer DC busbar structure 22 in accordance with an example of the present disclosure. Specifically, FIG. 3A shows a perspective view of the structure 22 and FIG. 3B shows a cross-section of the layers of the structure 22. The individual layers can be seen separately in the exploded view of FIG. 4, which provides a simplified top-down view of each layer.

As can be seen in FIGS. 3A and 3B, the DC busbar structure 22 is a three-layer structure. A first layer 24 contains a positive DC substrate 26 arranged to carry a positive DC voltage. Once constructed, the positive supply rail 12 is connected to the positive DC substrate 26.

A second layer 28 contains a negative DC substrate 30 arranged to carry a negative DC voltage. The negative supply rail 14 is arranged to be connected to the negative DC substrate 30.

Between the layers 24, 28 that carry the positive and negative DC substrates 26, 30 is a central layer 32, where the AC and DC neutral substrates 34, 36 are substantially coplanar and have a gap 33 between them. The central layer 32 includes an AC substrate 34 arranged to carry an AC voltage and a DC neutral substrate 36. Specifically, the node 16 between the DC link capacitors C1, C2 in FIG. 1 is connected to the DC neutral substrate 36. The nodes 18, 20 are connected to the AC substrate 34.

Shown with dotted lines on FIG. 3A are the positions of the connections to the internal branch module 6 and external branch modules 8, 10. The layered structure is provided with a number of downhole vias 38 that provide through-layer electrical connections to the substrates below, where these substrates correspond to those shown in FIGS. 2A-E. In the example shown in FIG. 3A, the configuration shown in FIG. 2C is in use, though the other configurations may be employed instead by changing the position of the substrates and downhole vias 38 as appropriate. Further downhole vias 40 provide for electrical connections to a drive circuit (not shown).

Figure 4:
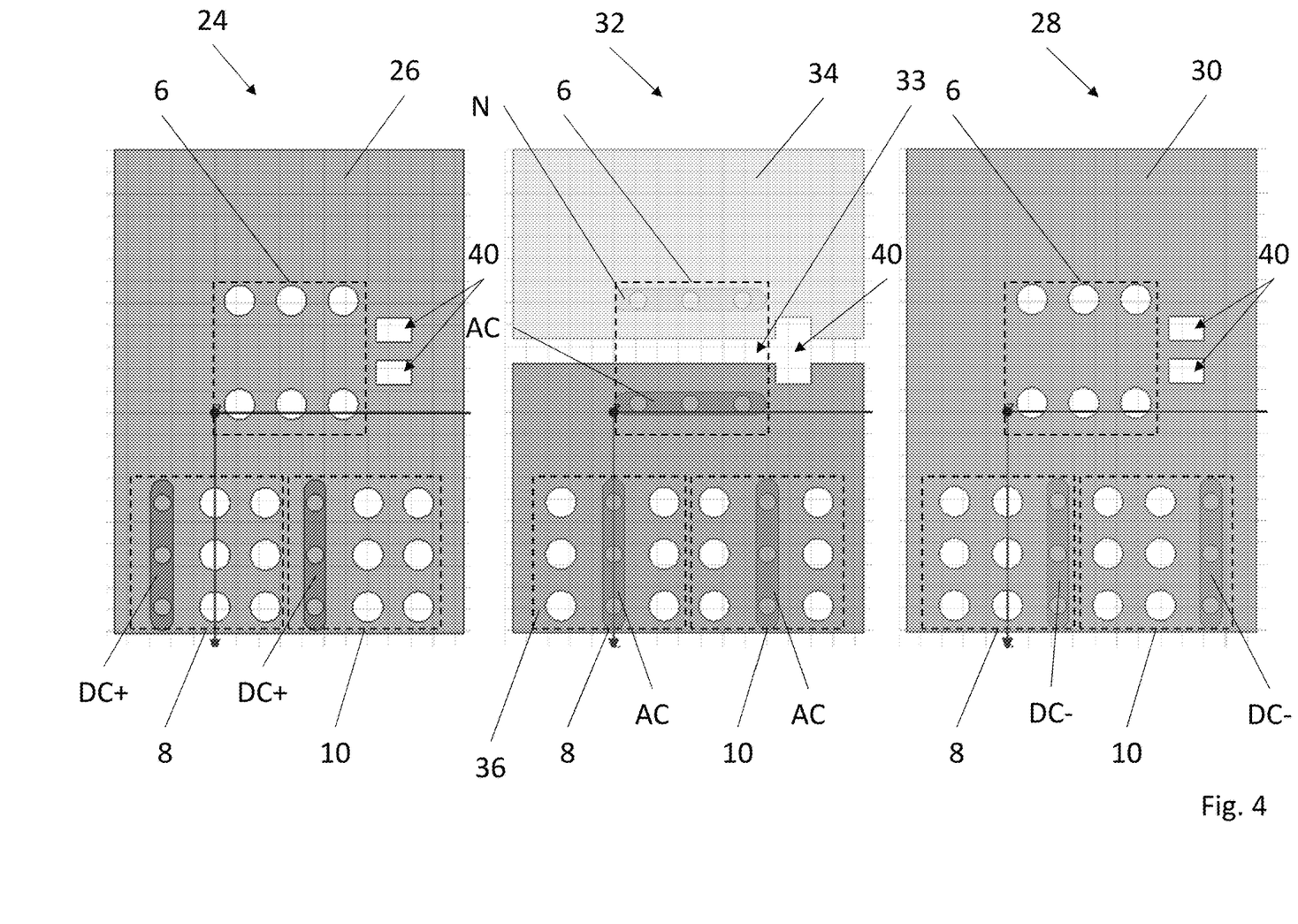
FIG. 4 is a schematic diagram providing an exploded view of the layers of FIGS. 3A-B.

With reference to the exploded view of FIG. 4, the connections between the substrates of the phase leg 2 and the substrates of the layered DC busbar 22 can be seen.

Figure 5:
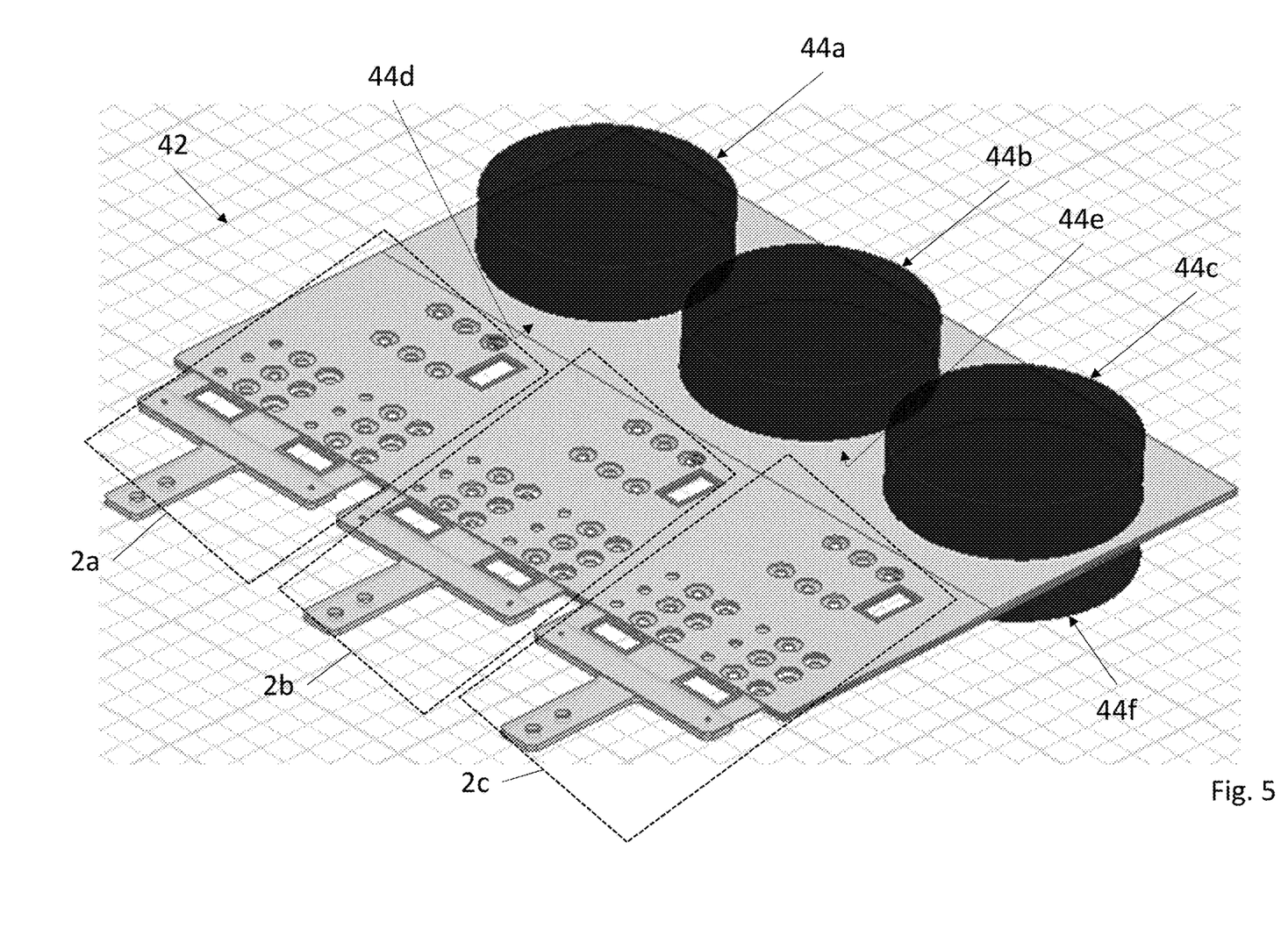
FIG. 5 is a schematic diagram of a three-phase power converter that uses three phase legs side-by-side.

FIG. 5 is a schematic diagram of a three-phase power converter 42 that uses three phase legs 2a-c. Each of the phase legs 2a-c utilises the same layered DC busbar structure described above. With respect to the DC busbar, the layered structure used with the three-phase power converter 42 has the positive, negative, and neutral DC substrates shared between all three phases, i.e. the respective positive and negative supply rails 12, 14 and first node 16 of each phase leg 2a-c are connected to common positive, negative, and neutral DC substrates 26, 30, 36 in the layered DC busbar structure respectively. However, each phase leg 2a-c is provided with its own AC substrate 34.

In this example, each phase leg 2a-c is also connected to a a pair of capacitor units 44a-f that provides the DC link capacitor functionality for the respective phase leg 2a-c, i.e. the pair of capacitor units 44a-f for each phase leg 2a-c provide the function of C1 and C2 as outlined above with respect to FIG. 1. However, this is optional and these phase legs 2a-c may share one or more capacitors and/or may be provided with multiple capacitors in any combination to provide the capacitance value required. Generally, the same number of capacitor units are provided above and below the busbar for symmetry. In FIG. 5, two of the capacitor units 44d, 44e are obscured from view (where a further capacitor unit 44f is partially obscured), however these are positioned underneath the busbar, opposite to the corresponding capacity units 44a-c above the busbar, as indicated by the dashed arrows that illustrate their respective positions.

Figure 6:
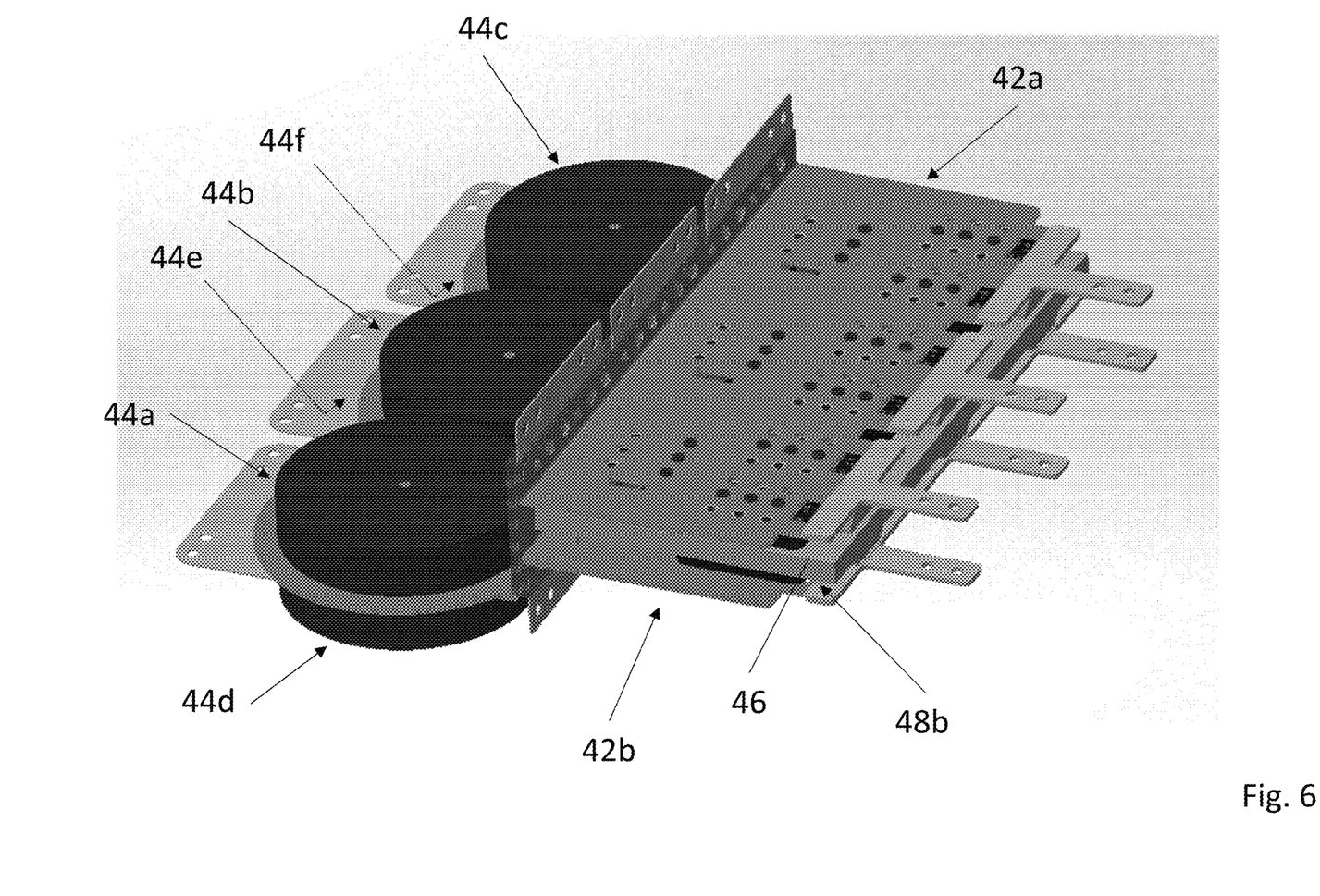
FIG. 6 is a schematic diagram of two three-phase power converters connected either side of a common heat sink.

FIG. 6 is a schematic diagram of two three-phase power converters 42a, 42b connected either side of a common heat sink 46. Each of these three-phase power converters 42a, 42b has the same structure as the three-phase power converter 42 of FIG. 5. The first three-phase power converter 42a is arranged on one side 48a of the heat sink 46 while the other three-phase power converter 42b is arranged on the opposite side 48b of the heat sink 46.

In this arrangement, the capacitor units 44a-f can be shared between the six phase legs, i.e. the two sets of three phase legs associated with each of the two three-phase power converters 42a, 42b. As above, the actual combination of capacitors used to supply the necessary capacitance value may be selected in accordance with the design requirements.

Figure 7A:
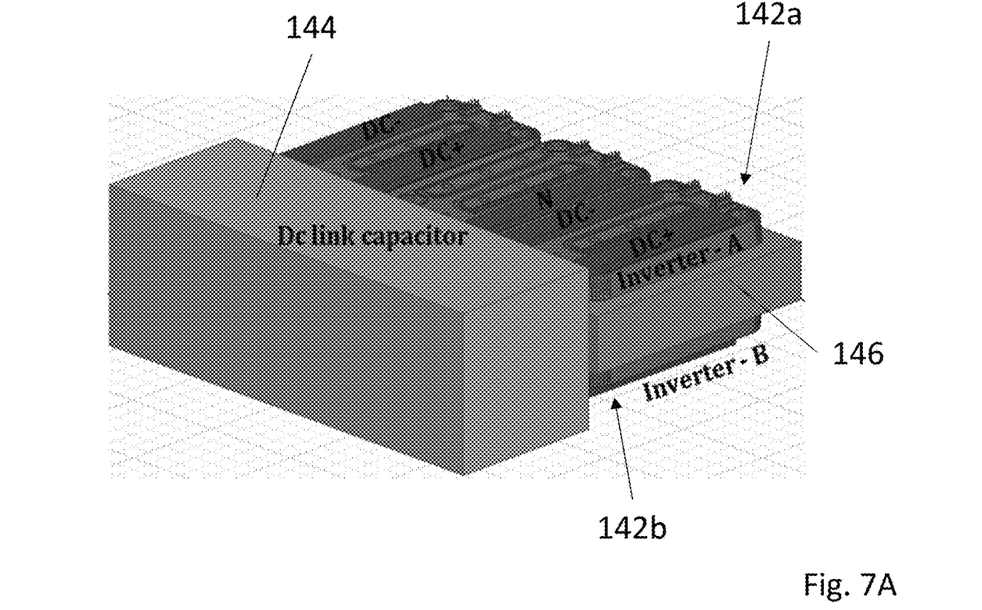
FIGS. 7A-B are schematics diagrams showing a double side cooled heat sink arrangement with connections to a common multi-terminal DC-link capacitor.
Figure 7B:
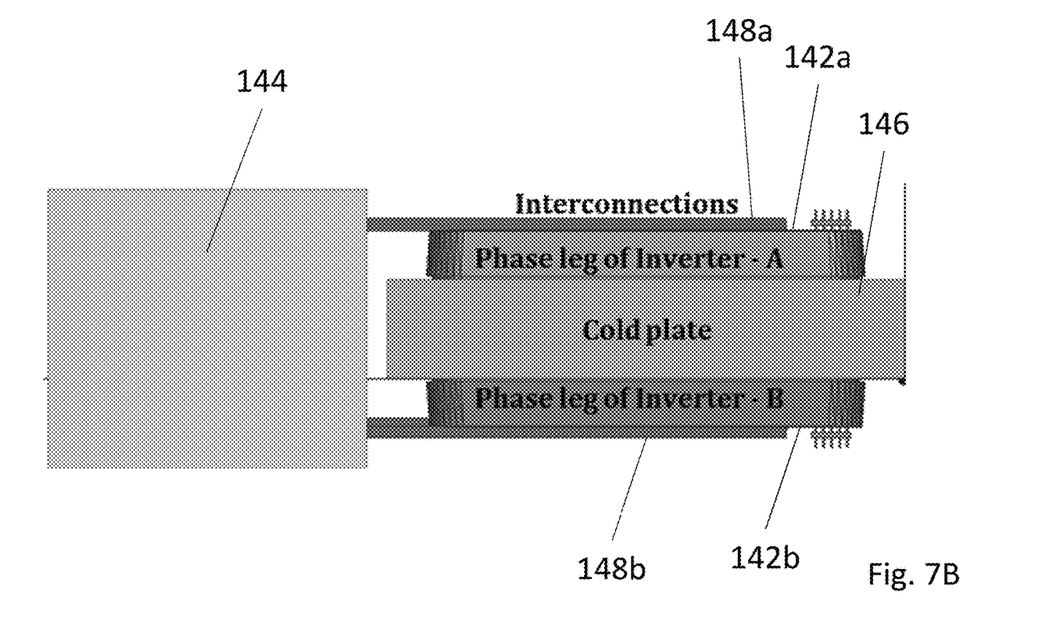

FIGS. 7A-B are schematics diagrams showing a double side cooled heat sink 146 arrangement with connections to a common multi-terminal DC-link capacitor 144. As in FIG. 6, two three-phase power converters 142a, 142b are connected either side of the double side cooled heat sink 146. In this arrangement, the capacitors are all provided in a single capacitor unit 144, which is mounted at the side of the double side cooled heat sink 146 and provided with interconnections 148a, 148b that run alongside, and are connected to, the three-phase power converters 142a, 142b respectively. This mounting arrangement is particularly compact because the interconnections 148a, 148b can be electrically connected directly to the appropriate layers of the layered DC busbar structure, without needing any 'bendings' of the conductive paths, as are generally required by conventional arrangements, further improving the parasitic performance compared to such conventional arrangements.

Thus examples of the present disclosure may provide a compact DC busbar structure for use in the DC link of power converters, e.g. three-level power converters. The structure outlined herein may advantageously have improved parasitic parameters (e.g. parasitic inductance) when compared to conventional busbars known in the art per se. While specific examples of the disclosure have been described in detail, it will be appreciated by those skilled in the art that the examples described in detail are not limiting on the scope of the disclosure.

The invention claimed is:

1. A layered DC busbar structure comprising:
    a positive DC substrate arranged to carry a positive DC voltage, said positive DC substrate being arranged on a first layer;
    a negative DC substrate arranged to carry a negative DC voltage, said negative DC substrate being arranged on a second layer;
    a DC neutral substrate arranged on a central layer between said first and second layers; and
    an AC substrate arranged to carry an AC voltage, said AC substrate being arranged on the central layer and substantially coplanar with the DC neutral substrate.

2. The layered DC busbar structure as claimed in claim 1, further comprising a plurality of AC substrates, each arranged to carry a respective AC voltage, wherein each AC substrate is arranged on the central layer and substantially coplanar with the DC neutral substrate.

3. The layered DC busbar structure as claimed in claim 1, wherein the positive and negative DC substrates substantially fully cover the central layer.

4. The layered DC busbar structure as claimed in claim 1, further comprising a plurality of vias that provide electrical connections between the substrates and the rails and nodes of an external power converter.

5. The layered DC busbar structure as claimed in claim 1, further comprising vias to provide for electrical connections to an external drive circuit.

6. A power converter comprising a DC link, wherein the DC link comprises a layered DC busbar structure as claimed in claim 1.

7. The power converter as claimed in claim 6, further comprising:
    a DC voltage supply connected between a positive DC supply rail and a negative DC supply rail, wherein the positive DC supply rail is connected to the positive DC substrate, and wherein the negative DC supply rail is connected to the negative DC substrate;
    a first capacitor and a second capacitor connected in series between said positive and negative DC supply rails, said first and second capacitors being connected at a first node therebetween, wherein the first node is connected to the DC neutral substrate;
    an internal branch module comprising a first switching arrangement connected between the first node and a second node, wherein the second node is connected to the AC substrate; and
    an external branch module comprising a second switching arrangement, said second switching arrangement comprising first and second switches connected in series at the second node.

8. The power converter as claimed in claim 7, wherein the power converter comprises an external AC circuit is connected to the second node, optionally wherein the external circuit comprises an inductor connected to the second node.

9. The power converter as claimed in claim 7, wherein the first and second capacitors are mounted directly on the layered substrates.

10. The power converter as claimed in claim 7, further comprising a second external branch module comprising a third switching arrangement, said second switching arrangement comprising first and second switches connected in series at the second node, optionally wherein the external branch modules are placed side by side.

11. The power converter as claimed in claim 7, wherein the internal branch module comprises first and second elongate substrates aligned along a first axis, said first elongate substrate being connected to the first node and said second elongate substrate being connected to the second node.

12. The power converter as claimed in claim 7, wherein the external branch module comprises first, second, and third elongate substrates aligned along a second axis, wherein the first elongate substrate is connected to the positive DC supply rail, the second elongate substrate is connected to the negative DC supply rail, and the third elongate substrate is connected to the second node.

13. The power converter as claimed in claim 6, further comprising a heat sink and a further layered DC busbar, wherein the first layered DC busbar is positioned on a first side of the heat sink and the second DC busbar is positioned on a second side of the heat sink, opposite to said first side.

\* \* \* \* \*